US011523498B2

(12) United States Patent
Grueter et al.

(10) Patent No.: US 11,523,498 B2
(45) Date of Patent: Dec. 6, 2022

(54) CIRCUIT BOARD HEAT SINK STRUCTURE AND METHOD THEREFOR

(71) Applicant: HELLA GMBH & CO. KGAA, Lippstadt (DE)

(72) Inventors: Frank Grueter, Lippetal (DE); Thomas Hofmann, Zella-Mehlis (DE); Matthias Mallon, Hamm (DE); Melanie Loebel, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 16/935,954

(22) Filed: Jul. 22, 2020

(65) Prior Publication Data
US 2020/0352021 A1 Nov. 5, 2020

Related U.S. Application Data

(63) Continuation of application No. PCT/EP2019/050626, filed on Jan. 11, 2019.

(30) Foreign Application Priority Data

Jan. 22, 2018 (DE) ...................... 10 2018 101 264.0

(51) Int. Cl.
H05K 1/02 (2006.01)
(52) U.S. Cl.
CPC ........... H05K 1/0209 (2013.01); H05K 1/021 (2013.01); H05K 1/0204 (2013.01);
(Continued)

(58) Field of Classification Search
CPC ............. H05K 7/2039; H05K 7/20454; H05K 7/20463; H05K 7/20472; H05K 7/205; H05K 7/2089–209; H05K 1/0201–0212; H05K 1/021; H05K 1/029; H05K 2201/06–068; H05K 2201/10416
See application file for complete search history.

(56) References Cited

U.S. PATENT DOCUMENTS 6,706,972 B1 * 3/2004 Martin ................... H05K 7/205
174/260
7,145,179 B2 12/2006 Petroski
(Continued)

FOREIGN PATENT DOCUMENTS

DE 199 49 429 A1 5/2001
DE 102 06 271 A1 8/2003
(Continued)

Primary Examiner — Zachary Pape
Assistant Examiner — Amir A Jalali
(74) Attorney, Agent, or Firm — Muncy, Geissler, Olds & Lowe, P.C.

(57) ABSTRACT

A circuit board heat sink structure having a circuit board and comprising a metallic heat sink, wherein the circuit board has a metal substrate, an insulation layer and a conductor layer, and the wherein the circuit board is arranged on the heat sink in such a way that the metal substrate contacts a locating face of the heat sink. At least one heat transition point is formed between the heat sink and the metal substrate, which provides a defined metallic contact between the material of the heat sink and the material of the metal substrate. A method is also provided for forming the circuit board heat sink structure.

10 Claims, 2 Drawing Sheets

(52) U.S. Cl.
CPC ............ *H05K 2201/0305* (2013.01); *H05K 2201/09063* (2013.01); *H05K 2201/10416* (2013.01)

(56) References Cited

U.S. PATENT DOCUMENTS

| | | | |
|---|---|---|---|
| 7,997,760 B2 * | 8/2011 | Suzuki | F21V 29/83 |
| | | | 362/249.01 |
| 8,240,882 B2 * | 8/2012 | Liao | F21V 33/00 |
| | | | 362/249.02 |
| 10,736,206 B2 | 8/2020 | Barrass et al. | |
| 2005/0178574 A1 * | 8/2005 | Noguchi | H01L 23/3677 |
| | | | 174/535 |
| 2007/0240899 A1 | 10/2007 | Sakamoto | |
| 2007/0267642 A1 * | 11/2007 | Erchak | H01L 33/642 |
| | | | 257/98 |
| 2010/0240158 A1 | 9/2010 | Ter-Hovhannissian | |
| 2012/0092833 A1 * | 4/2012 | Chang | H05K 1/0209 |
| | | | 361/710 |
| 2013/0298396 A1 * | 11/2013 | Bi | H05K 1/0204 |
| | | | 29/829 |
| 2014/0035118 A1 * | 2/2014 | Bayerer | H01L 23/36 |
| | | | 257/690 |
| 2014/0301042 A1 * | 10/2014 | Stella | H05K 13/0465 |
| | | | 361/709 |
| 2015/0029669 A1 * | 1/2015 | Liskow | F16H 61/0006 |
| | | | 361/709 |
| 2015/0257249 A1 * | 9/2015 | Kim | H05K 1/0204 |
| | | | 361/700 |
| 2017/0103934 A1 * | 4/2017 | Nuttall | H01L 23/552 |
| 2019/0295919 A1 * | 9/2019 | Sanda | H01L 21/565 |

FOREIGN PATENT DOCUMENTS

| | | |
|---|---|---|
| DE | 103 35 129 B3 | 6/2005 |
| DE | 10 2009 053 999 A1 | 5/2011 |
| DE | 10 2012 216 805 A1 | 3/2014 |
| DE | 10 2013 213 448 A1 | 1/2015 |
| EP | 1 395 100 A1 | 3/2004 |
| EP | 1 890 341 A1 | 2/2008 |
| WO | WO 2006/044027 A2 | 4/2006 |
| WO | WO 2017/017448 A2 | 2/2017 |

* cited by examiner

CIRCUIT BOARD HEAT SINK STRUCTURE AND METHOD THEREFOR

This nonprovisional application is a continuation of International Application No. PCT/EP2019/050626, which was filed on Jan. 11, 2019, and which claims priority to German Patent Application No. 10 2018 101 264.0, which was filed in Germany on Jan. 22, 2018, and which are both herein incorporated by reference.

BACKGROUND OF THE INVENTION

Field of the Invention

The present invention relates to a circuit board heat sink structure and a method for forming a circuit board heat sink structure, with a circuit board and with a metallic heat sink, wherein the circuit board comprises a metal substrate, an insulation layer and a conductor layer, and wherein the circuit board is arranged such on the heat sink that the metal substrate contacts a locating face of the heat sink.

Description of the Background Art

DE 10 2013 213 448 A1 discloses a circuit board heat sink structure with a circuit board and with a metallic heat sink, and the circuit board comprises a metal substrate, an insulation layer and a conductor layer. The circuit board is arranged on a locating face of the heat sink in such a way that the metal substrate contacts the locating face of the heat sink. Although the plane-parallel design of the locating face and the metal substrate is suitable for achieving substantially flat contact, there is usually a residual air gap between the metal substrate and the locating face, which is generally filled with a thermal paste. The application of a thermal paste, however, is complicated and requires additional process steps, wherein a thermal paste subsequently forms thermal resistance that is greater than direct metallic contact. Full surface contact of the metal substrate on the locating face of the heat sink cannot be achieved by simple means.

It is, however, possible for the circuit board to be screwed with the heat sink such that the metal substrate contacts the heat sink at least at certain points, as shown for example in DE 10 2009 053 999 A1. Here, the screw connections are located in the corner areas, and the circuit board heat sink structure does not allow for optimal thermal conduction from the circuit board to the heat sink near the position of the electronic components that are to be cooled. As a rule, the electronic components, in particular semiconductors, preferably LED-type semiconductor elements, are positioned on the conductor layer, and the components are often surface-mounted, thus being designed as so-called SMD components. In principle, the thermal conduction must overcome the insulation layer, thereby forming a first heat barrier. The further heat barrier forms between the metal substrate and the locating face of the heat sink, and despite the screw connection, no flat contact of the metal substrate on the locating face of the heat sink is achieved. Air gaps are formed between the metal substrate and the locating face, in particular in the central areas at a distance from the screw connections, which form considerable thermal resistance.

In lighting devices, the semiconductor light emitter are at least mounted on the circuit board, and because of the considerable heat that is formed in the operation of the light emitter, the cooling of the circuit board from the conductor layer side via the metal substrate to the heat sink must be achieved. Possible air gaps should be avoided, wherein it is particularly desirable to have a metallic contact between the metal substrate and the heat sink in the proximity of the light emitter. A screw connection can generally not be used in headlights for cars, even with small-sized lighting devices, since there is generally not enough space.

EP 1 395 100 A1 discloses a circuit board comprising a conductor layer, an insulation layer and a metal substrate, and, for cooling the conductor layer, for example comprising copper traces, connections are suggested for connecting the heat sink with at least one terminal, in particular an earth terminal of the earth layer. The connection is made by stamping and caulking a projection, which is to be created by an opening in the conductor layer and in the insulation layer. However, in this case only the transfer resistance from the conductor layer to the metal substrate is minimized, and the arrangement of another heat sink, on which the circuit board is placed with the metal substrate itself, is not provided.

SUMMARY OF THE INVENTION

It is therefore an object of the present invention to improve a circuit board heat sink structure and a method therefor, wherein the thermal conduction between the circuit board and the heat sink is to be further improved. In particular, the use of thermal paste should be avoided. In addition, it is another object of the invention to improve the thermal conduction also for small circuit board heat sink structure sizes, in particular avoiding screw connections.

In an exemplary embodiment, at least one heat transition point is formed between the heat sink and the metal substrate, which forms a defined metallic contact between the material of the heat sink and the material of the metal substrate.

A provision of the invention is the formation of at least one, and preferably a plurality, of heat transition points between the circuit board and the heat sink, and that the thermal conduction which is made possible at certain points is based on a metallic contact between the material of the heat sink and the material of the metal substrate. The heat transition point can have a lateral extent corresponding to, for example, the thickness of the circuit board. For example, the heat transition point can have a main dimension, in particular a diameter of 1 mm to 5 mm.

The metal contact can be a direct material contact between the material of the metal substrate and the material of the heat sink, wherein it is also conceivable to provide an auxiliary substrate that is made of metal and forms a thermal bridge between the material of the heat sink and the metal substrate.

The metallic contact can be formed by pressing the material of the heat sink with the material of the metal substrate. For example, the heat transition point has a projection which protrudes from the locating face of the heat sink. The projection can be produced, for example, in the original mold or other shaping manufacturing process of the heat sink, or the projection is produced by pressing or by some other plastic action on the heat sink. Furthermore, an opening is advantageously provided in the circuit board, wherein the pressing may be made between the projection and the opening. The projection and the opening can be made to overlap in such a manner that the projection initially extends without lateral force towards the opening wall of the opening, into the latter. For example, the pressing can be made between the projection and the opening by means of a plastic deformation introduced into the projection. Thus, it is in particular possible to impress a slot or a cone from a vertical line in the center of the projection, resulting in lateral displacement of the material of the projection, formed from the material of the heat sink. Due to the arrangement of the projection in the opening in the circuit board, the material of the projection can be pressed with the material of the metal substrate. The projection thereby has a height, which is approximately equal to the thickness of the metal substrate.

The defined metallic contact between the material of the heat sink and the material of the metal substrate is formed by a solder, such that the defined metallic contact is indirectly implemented via the solder. The solder can be previously provided as a solid or a paste, and with particular advantage, the solder can provide a cohesive contact with the metal substrate and the heat sink in a reflow soldering process, wherein the reflow soldering process is used to solder the electronic components to the conductor layer, which is necessary anyway.

Alternatively, a recess that overlaps with the opening can be made in the locating face of the heat sink, wherein said recess and the opening are filled with the solder at least in sections. However, the solder can also be introduced into a radially circumferential space between a projection and the opening. It is ensured that the solder fills the opening in the circuit board in such a way that only the metal substrate is wetted with solder, which forms the inner wall of the opening, but not the insulation layer and in particular not the conductor layer.

The invention further relates to a method for forming a circuit board heat sink structure, wherein the method according to the invention provides the following steps: the formation of a projection or a recess in the locating face of the heat sink, the formation of an opening in the circuit board, the arrangement of the circuit board on the locating face of the heat sink such that the opening is made to overlap with the projection or with the recess, and the formation of a defined metallic contact between the material of the heat sink and the material of the metal substrate either a) by pressing the material of the heat sink with the material of the metal substrate, or b) indirectly by introducing solder in the opening.

The soldering of the materials of the metal substrate and the heat sink in this case can take place in a reflow soldering process, wherein the reflow soldering process for soldering the electrical components can be used on the conductor layer so as to also melt the solder at the transition point and to solder the materials.

However, pressing can be carried out with a corresponding tool, and if the opening extends over the entire thickness of the circuit board, the opening is accessible from the top of the circuit board. If there is a projection in the opening, formed from or on the heat sink, this projection can be pressed by plastic deformation with the wall of the opening in such a way that the metallic contact is created directly between the material of the heat sink and the material of the metal substrate.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
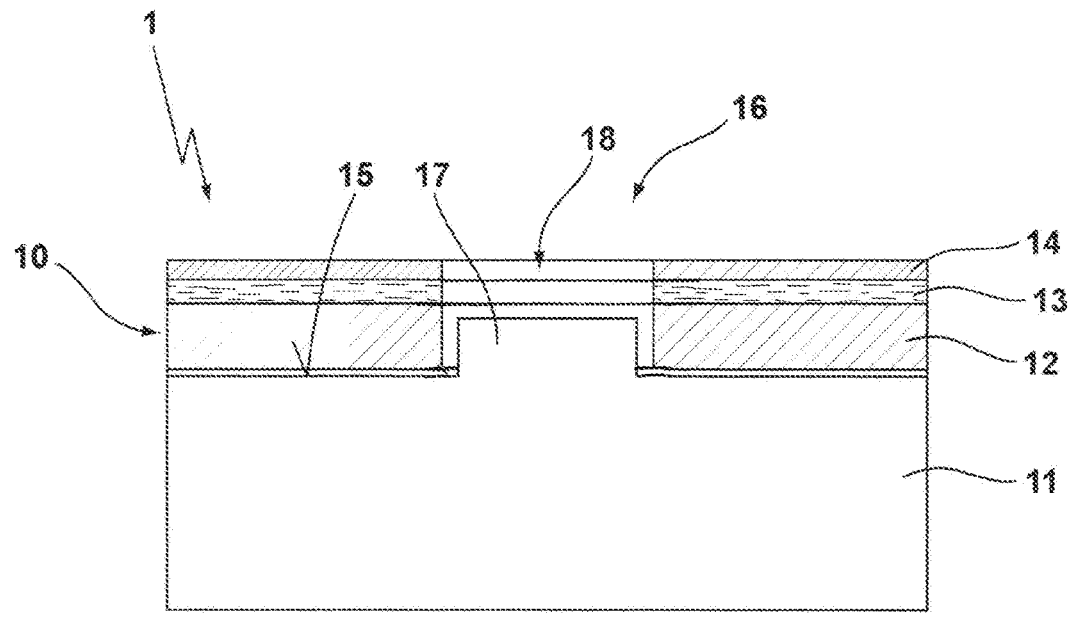
FIG. 1 shows a schematic side view of a circuit board heat sink structure for preparing a heat transition point, on the basis of pressing.
Figure 2:
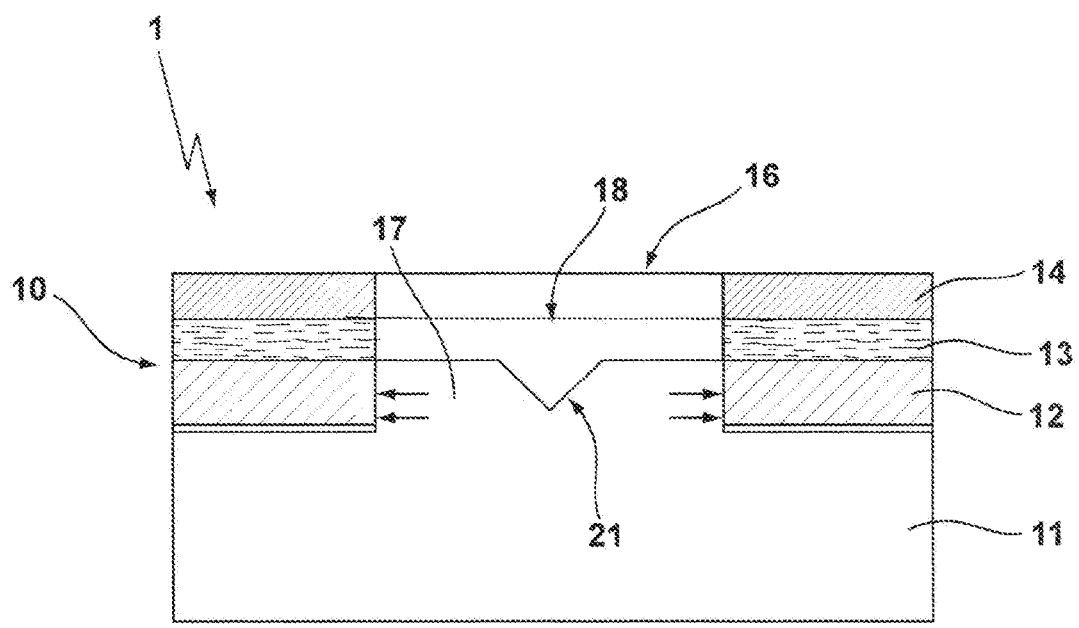
FIG. 2 shows the circuit board heat sink structure according to FIG. 1 with a pressed projection in an opening of the circuit board.

FIGS. 1 and 2 show a circuit board heat sink structure 1 comprising a circuit board 10 and comprising a heat sink 11, and the circuit board 10 is applied to a locating face 15 of the heat sink 11. The circuit board 10 has a metal substrate 12, an insulation layer 13 and a conductor layer 14. The circuit board 10 is mounted to the locating face 15 of the heat sink 11 in such a way that the underside of the metal substrate 12 contacts the locating face 15 of the heat sink 11.

The view shows a first exemplary embodiment of a heat transition point 16 for forming a thermal bridge between the metal substrate 12 of the circuit board 10 and the heat sink 11. The heat transition point 16 has a projection 17 which is formed by the heat sink 11 and protrudes from the locating face 15. An opening 18 is introduced in the circuit board 10, which has a diameter slightly greater than the diameter of the projection 17.

As shown in FIG. 2, a plastic deformation 21 has been introduced from the free upper side through the opening 18 into the projection 17, as a result of which the material of the heat sink 11, which forms the projection 17, is pressed radially outward. Thereby, direct metallic contact between the material of the heat sink 11 and the material of the metal substrate 12 is created. The pressing operation is indicated by corresponding force arrows.

The plastic deformation 21 can be introduced in an advantageous manner from the upper side into the projection 17, and in particular, the heat sink 11 may be made of aluminum, whereby plastic deformation is possible already at a lower force, with which the projection 17 can be acted upon. The plastic deformation 21 is shown as a notch, which can extend diametrically through the projection 17. It is also conceivable, for example, to introduce a cone-shaped or a cylindrical recess in the projection 17 with a punch or a comparable tool, so that the plastic deformation 21 generates a radially encircling contact of the projection 17 with the inner wall of the opening 18 in the area of the metal substrate 12. The metallic contact is advantageously formed in a radially circumferential manner, wherein it may also be sufficient to create approximately a bilateral, mutually opposing two-sided pressing operation, for example by introducing the shown slot-like plastic deformation 21.

Figure 3:
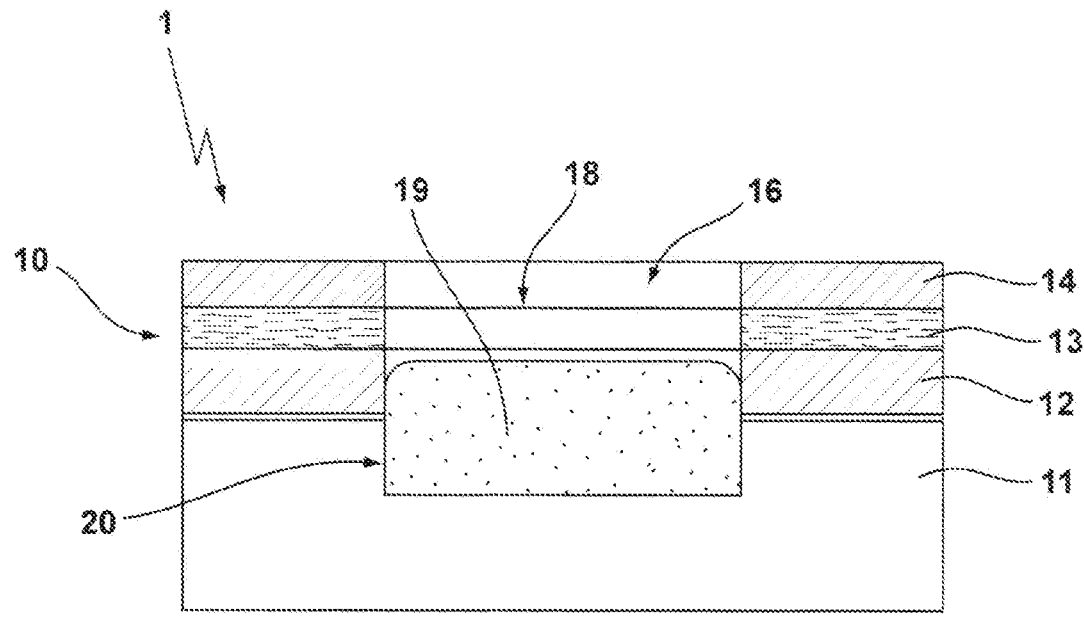
FIG. 3 shows a schematic view of a circuit board heat sink structure with a heat transition point, according to a further embodiment
Figure 4:
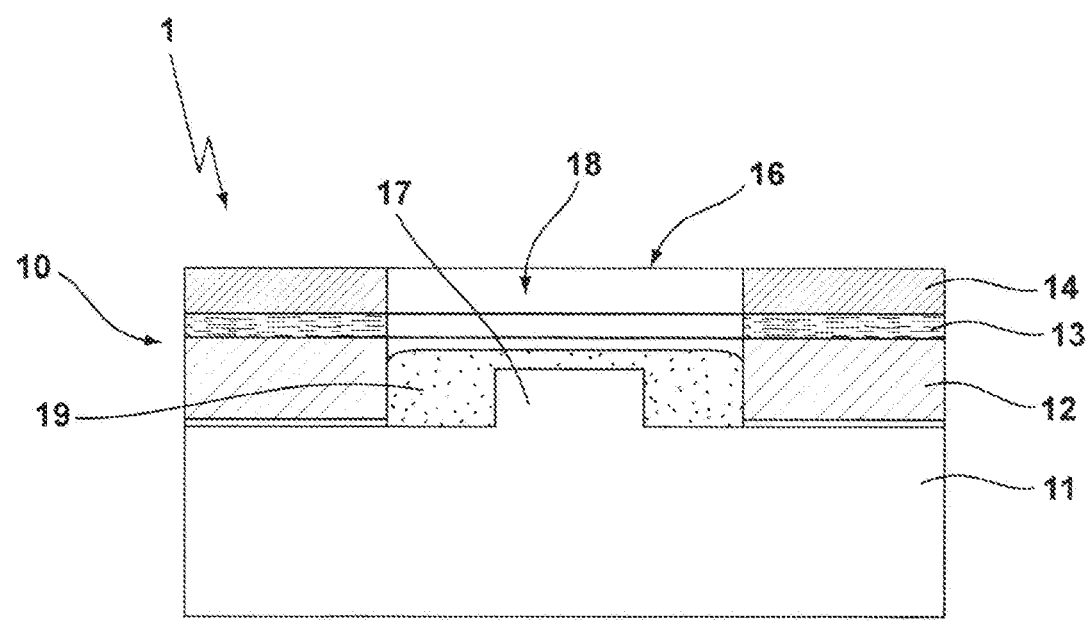
FIG. 4 shows a schematic side view of a circuit board heat sink structure according to yet another embodiment.

FIGS. 3 and 4 show another embodiment of forming the heat transition point 16, with the metallic contact being between the material of the heat sink 11 and the material of the metal substrate 12. The heat sink 11 again has the structure comprising the metal substrate 12, the insulation layer 13 and the conductor layer 14, wherein the metallic contact is produced via a solder 19.

In FIG. 3, the heat transition point 16 of the circuit board heat sink structure is formed by a solder 19, which is introduced in a recess 20 in the heat sink 11 and is filled in such a way that it also fills in the opening 18, at least above the height of the metal substrate 12. Here, the opening 18 is made to overlap with the recess 20. The solder 19 may be melted in the reflow soldering process, which process can already be used for connecting the electronic components on the conductor layer 14.

FIG. 4 shows the exemplary embodiment with the heat transition point 16 based on a solder 19 surrounding an annular gap between the projection 17, which extends into the opening 18. The circuit board 10, which is composed of the metal substrate 12, the insulation layer 13 and the conductor layer 14, has an opening 18 extending over the entire thickness of the circuit board 10. However, in accordance with this embodiment, too, the solder 19 is only filled to such an extent that the inside of the hole wall of the opening 18 is wetted in the area of the metal substrate 12.

The invention makes use of the possibility of providing discrete heat transition points 16, either by pressing the metallic materials of the heat sink 11 with the metal substrate 12 or by soldering with a solder 19. The heat transition points 16 can in particular be introduced in the area between the circuit board 10 and the heat sink 11, in which the components to be cooled are arranged, for example, semiconductor light sources. Such a circuit board heat sink structure 1 can be used in particular in lighting devices for motor vehicles, in particular headlights.

The invention is not limited to be implemented according to the above-described preferred embodiment. Rather, a number of variants are conceivable, which make use of the illustrated solution even in fundamentally different embodiments. All features and/or advantages arising from the claims, the description or the drawings, including design details, spatial arrangements and process steps, can be essential to the invention by themselves or in a variety of combinations.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit board heat sink structure comprising:
   a circuit board, the circuit board comprising a metal substrate, an insulation layer and a conductor layer;
   a metallic heat sink, the circuit board being arranged on the heat sink such that the metal substrate contacts a locating face of the heat sink; and
   at least one heat transition point formed between the heat sink and the metal substrate, the at least one heat transition point providing a defined metallic contact between the material of the heat sink and the material of the metal substrate,
   wherein the heat transition point has a projection that protrudes from the locating face of the heat sink and extends into an opening in the circuit board, the projection having a height that is less than a thickness of the metal substrate of the circuit board, and
   wherein the opening extends entirely through each of the metal substrate, the insulation layer and the conductor layer.

2. The circuit board heat sink structure according to claim 1, wherein the defined metallic contact is formed by pressing the material of the heat sink with the material of the metal substrate.

3. The circuit board heat sink structure according to claim 2, wherein the pressing is formed between the projection and the opening.

4. The circuit board heat sink structure according to claim 3, wherein the pressing between the projection and the opening is formed by a plastic deformation introduced in the projection.

5. The circuit board heat sink structure according to claim 1, wherein the defined metallic contact between the material of the heat sink and the material of the metal substrate is formed by a solder, so that the defined metallic contact is formed indirectly via the solder.

6. The circuit board heat sink structure according to claim 5, wherein the solder is introduced into a radially circumferential space between the projection and the opening.

7. The circuit board heat sink structure according to claim 6, wherein the solder partially fills the opening, such that a height of the solder within the opening is less than the thickness of the circuit board.

8. A method for forming a circuit board heat sink structure according to claim 1, the method comprising:
   forming the projection to protrude from the locating face of the heat sink;
   forming the opening in the circuit board to extend entirely through each of the metal substrate, the insulation layer and the conductor layer;
   arranging the circuit board on the locating face of the heat sink so that the opening is made to overlap with the projection; and
   forming the defined metallic contact between the material of the heat sink and the material of the metal substrate, either by pressing the projection of the heat sink to deform the material of the heat sink in a radial direction towards the metal substrate or indirectly by introducing solder in the opening, so that with the defined metallic contact, the projection has the height that is less than the thickness of the metal substrate of the circuit board.

9. The method according to claim 8, wherein the circuit board is a stacked layer structure such that the insulation layer is stacked on top of an upper surface of the metal substrate and the conductor layer is stacked on top of an upper surface of the insulation layer.

10. The circuit board heat sink structure according to claim 1, wherein the circuit board is a stacked layer structure such that the insulation layer is stacked on top of an upper surface of the metal substrate and the conductor layer is stacked on top of an upper surface of the insulation layer.

* * * * *